United States Patent
Grover et al.

(10) Patent No.: US 9,240,780 B1
(45) Date of Patent: Jan. 19, 2016

(54) PREVENTING VOLTAGE PULSE PROPAGATION IN A DISABLED CAPACITIVE FEEDBACK SLEW-CONTROLLED SWITCH

(71) Applicant: Continental Automotive Systems, Inc., Auburn Hills, MI (US)

(72) Inventors: Jason Grover, Mundelein, IL (US); Martin Krajci, Palatine, IL (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 0 days.

(21) Appl. No.: 14/336,404

(22) Filed: Jul. 21, 2014

(51) Int. Cl.
*H03K 17/16* (2006.01)
*H03K 17/687* (2006.01)

(52) U.S. Cl.
CPC .......... *H03K 17/165* (2013.01); *H03K 17/6877* (2013.01)

(58) Field of Classification Search
USPC ................. 327/170, 337, 362–363, 381–382; 323/271, 293
See application file for complete search history.

(56) References Cited

U.S. PATENT DOCUMENTS

| | | | | |
|---|---|---|---|---|
| 5,539,610 | A * | 7/1996 | Williams | H02H 11/003 307/10.7 |
| 5,764,465 | A * | 6/1998 | Mattes | H02H 11/003 361/77 |
| 6,590,439 | B1 | 7/2003 | Larson | |
| 7,049,796 | B2 * | 5/2006 | Cherniski | H02H 9/004 323/271 |
| 8,310,798 | B2 * | 11/2012 | Grover | H03K 17/166 361/111 |
| 2014/0002105 | A1 | 1/2014 | Hata et al. | |
| 2014/0184278 | A1 | 7/2014 | Zheng | |

OTHER PUBLICATIONS

Search Report dated Feb. 20, 2015, from corresponding GB Patent Application No. GB1415035.3.

* cited by examiner

*Primary Examiner* — An Luu

(57) ABSTRACT

Transient voltages are not propagated through a P-channel MOSFET used as a switch with output slew rate control feedback, by connecting a low or near-zero impedance across the source and gate terminals of the device whenever the MOSFET is supposed to be off. The low or near-zero impedance is provided by a second P-channel MOSFET connected across the source and gate of the MOSFET switch.

13 Claims, 3 Drawing Sheets

US 9,240,780 B1

PREVENTING VOLTAGE PULSE PROPAGATION IN A DISABLED CAPACITIVE FEEDBACK SLEW-CONTROLLED SWITCH

BACKGROUND

In an automotive electrical system, it is often critically important that devices directly connected to the vehicle battery limit the current they consume during low power scenarios, such as when vehicle ignition is off. This is to prevent unnecessary discharge of the vehicle battery while the engine is not running. In order to achieve this goal in an automotive electronic device, it is common practice to place one or more power switches in series between the battery input of the power system and the power inputs of downstream circuitry in order to allow them to be fully powered off during low power scenarios.

The power supply line for integrated circuits and downstream loads is typically decoupled with a several distributed capacitances to ground. That distributed capacitance, along with any other lumped parallel capacitance, is electrically equivalent to a short circuit during the occurrence of high frequency voltage transients on the power supply line, such as the fast turn-on transition caused by an upstream power switch. Uncontrolled inrush current into distributed capacitance can cause damage to the power switch, upstream components or the capacitors themselves, and can also potentially blow an upstream fuse.

When using a voltage-controlled semiconductor-based switch, whose output is controlled based on the difference between its control node and its input (such as a P-channel MOSFET), it is a common practice to introduce capacitive feedback from the output of the switch to the control node of the switch so that the slew rate of the voltage ramp that it applies to the downstream distributed capacitance during its turn-on transition is precisely controlled, thereby limiting the inrush current that is conducted into the downstream distributed capacitance while providing a predictable turn-on time. For the "off" state, a resistance is typically connected between the gate and the source of the MOSFET. An unfortunate consequence of using such a slew-rate controlling capacitance connected from output to control node of a semiconductor switch, along with a resistor to effectuate the "off" state, is that the off-state resistor and slew-rate controlling capacitance can create a mechanism that enables or turns on the semiconductor switch if an upstream voltage transient occurs by introducing a transient difference between the input and the control node. Thus the switch with output-connected capacitive slew-rate control feedback may not always fulfill its duty of blocking downstream current when it is expected to be disabled.

An apparatus and method for effectively suppressing the propagation or transmission of voltage transients through a semiconductor switch having a slew rate that is controlled using output-connected capacitive feedback, when the switch is expected to be disabled, would be an improvement over the prior art.

BRIEF SUMMARY

In accordance with embodiments of the invention, transient voltages are not propagated through a P-channel MOSFET used as a switch with output slew rate control feedback, by connecting a low or near-zero impedance across the source and gate terminals of the device whenever the MOSFET is supposed to be off. The low or near-zero impedance is provided by a second P-channel MOSFET connected across the source and gate of the MOSFET switch.

DETAILED DESCRIPTION

Those of ordinary skill in the art know that a P-channel MOSFET is a field effect transistor in which an electrically conductive, low-resistance channel made of "holes" is formed in an n-type semiconductor substrate by the application of a negative voltage between the gate and source. The "holes," which can be considered to be, or have, positive charges, are thus "attracted" to the negatively-charged gate. Stated another way, in a P-channel MOSFET, a conductive channel will be formed and the device turned "on" when the voltage on the gate is "negative" relative to the voltage on the source. The P-channel MOSFET will be turned "off" when the gate voltage is positive or greater than the source voltage.

An N-channel MOSFET is a complement of a P-channel MOSFET. A conductive channel is formed in a p-type substrate and the device turned "on" when the gate-source voltage is positive because electrons in the substrate are attracted to the positively-charged gate. An N-channel MOSFET is turned "off" when the gate-source voltage is zero or negative relative to the source.

As used herein, the term, "slew rate," refers to the rate at which a voltage changes, in either direction. Slew rate is measured in units of volts per second.

The term, "transient" refers to a momentary departure of a voltage or current from a steady-state condition and back to a steady state condition as a result of a system disturbance. Transients can be "normal" or "abnormal." Normal transients occur as a result of normal disturbances in a circuit such as a load change. Abnormal transients result from abnormal disturbances such as a power interruption or a wire fault.

As used herein, "impedance" refers to resistive and reactive attributes of a component in an alternating current circuit. If there are no components in a circuit that have reactive attributes or if the current is not alternating current, an impedance is entirely resistive.

As used herein, the term, "low" should be construed to be a voltage, the magnitude of which is zero or nearly zero volts. "High" should be construed to be voltage that is greater than zero, typically three or more volts, depending on the particular type of semiconductor device being used.

Figure 1:
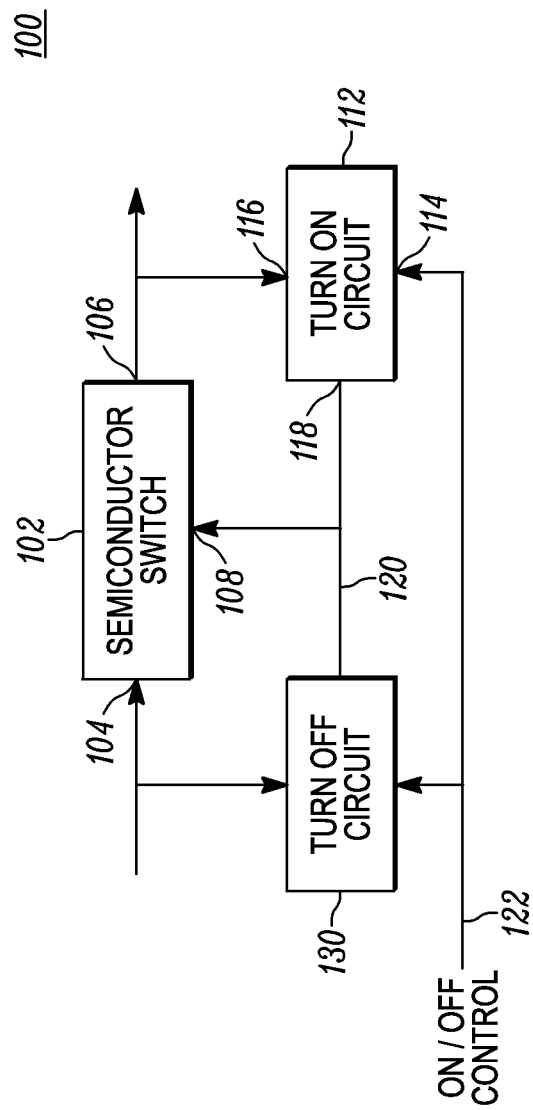
FIG. 1 is a block diagram of an apparatus for preventing the propagation of a transient voltage through a semiconductor switch, an output of which has a slew rate that is controlled using capacitive feedback.

FIG. 1 is a block diagram of a switching circuit 100 configured to eliminate or at least significantly reduce the propagation of transient voltage through a semiconductor switch 102 that is configured to provide an output voltage having a slew rate controlled by a turn on circuit 112. The turn on circuit 112 is typically embodied at least in part as a capacitor such as the capacitor identified in FIG. 2 by reference numeral 214 and a transistor such as the one identified by reference numeral 216.

Figure 2:
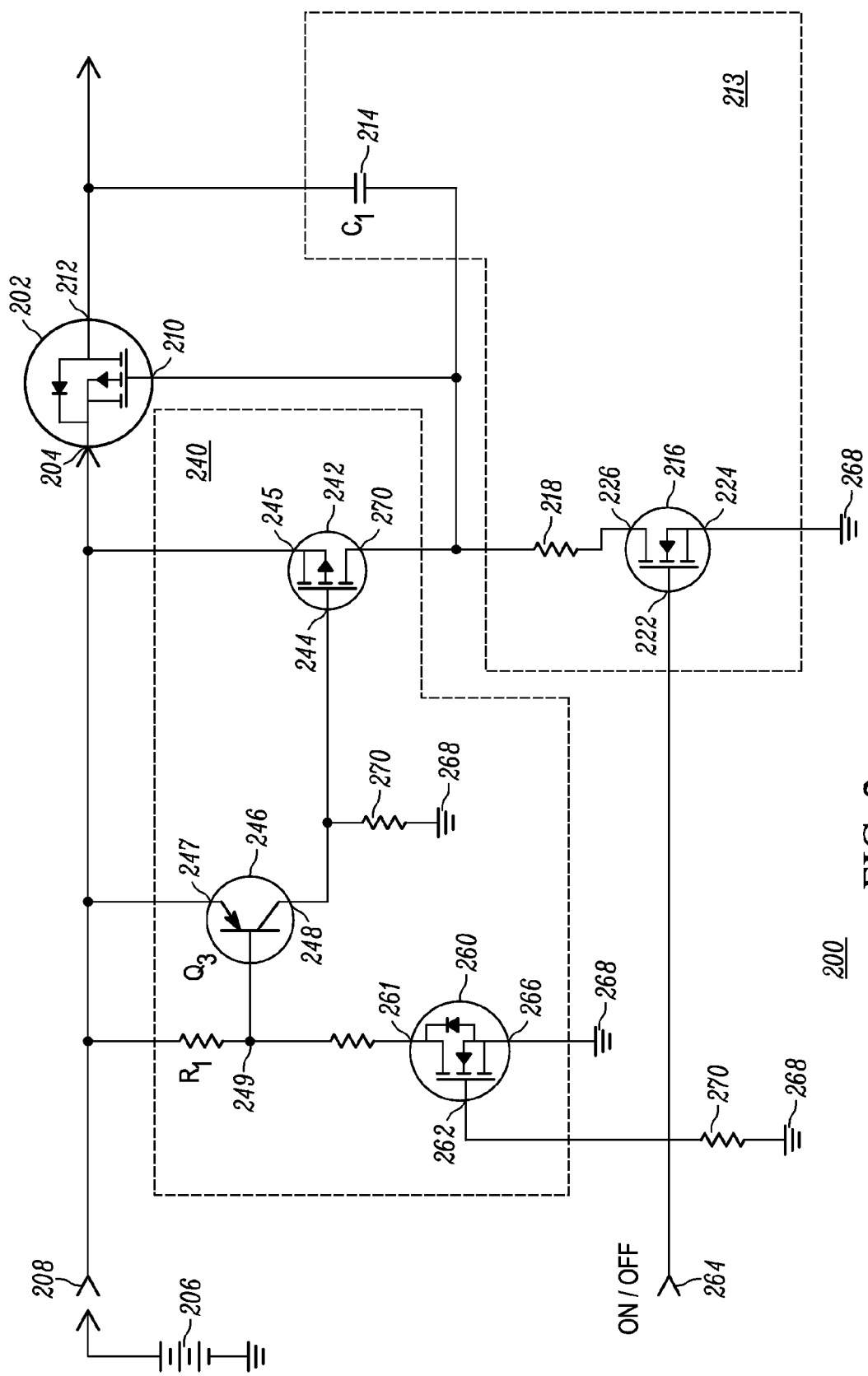
FIG. 2 is a schematic diagram of a switching circuit which prevents transient voltage feedback through a P-channel MOSFET.

The semiconductor switch 102 is preferably embodied as a conventional P-channel MOSFET 102, as also shown in FIG. 2. It has a source, which is denominated herein as a first input terminal 104, a drain, which is denominated as a first output terminal 106 and a gate, which is denominated as a first control input terminal 108. Since the semiconductor switch 102 has three separate terminals or connection nodes, it is considered to be a 3-terminal switch, one terminal of which controls its operation, namely, the first control input terminal or gate 108.

In addition to the semiconductor switch 102, the circuit 100 additionally comprises the aforementioned turn on circuit 112. The turn on circuit 112 determines the slew rate of the voltage on the first output terminal 106. As described below and as shown in FIG. 2, the turn on circuit 112 preferably comprises at least a capacitor but can also include a transistor, such as an N-channel MOSFET.

As the turn-on circuit 112 is drawn in FIG. 1, the turn on circuit 112 has three terminals. The terminals of the turn-on circuit 112 are referred to herein as a second input terminal 114, a second control terminal 116, and a second output terminal 118.

The turn on circuit 112 provides a voltage feedback signal to the first control input terminal 108 from the first output terminal 106, i.e., it couples voltage at the first output terminal 106 back to the first control input terminal 108 via its second output terminal 118. Since the first control input terminal 108 controls the voltage that is output from the semiconductor switch 102, the turn on circuit 112 controls the rate at which the output voltage from the output terminal 106 changes. Stated another way, the turn on circuit 112 controls the slew rate of the output voltage using a capacitive feedback.

Still referring to FIG. 1, the switching circuit 100 additionally comprises a turn off circuit 130. As the turn off circuit 130 is drawn, it too is considered to be a three-terminal device. It is coupled between the first input terminal 104 of the switch 102 and the first control input 108.

As described below and as shown in FIG. 2, the turn off circuit between the input terminal and control input of a semiconductor switch is configured to provide a high impedance between input terminal and the control input whenever the semiconductor switch is supposed to be turned off, which is to say, whenever the semiconductor switch is supposed to be "off", the turn off circuit is driven to a high-impedance state. Essentially no steady-state current flows through the turn off circuit when it is in its high-impedance state.

FIG. 2 is a schematic diagram of a preferred embodiment of a switching circuit 200, which prevents or at least reduces transient voltage propagation through a semiconductor switch embodied as MOSFET and specifically a P-channel power MOSFET 202. As with the semiconductor switch 102 shown in FIG. 1, the power MOSFET 202 shown in FIG. 2 has a source terminal 204, which is configured to be coupled to a vehicle battery 206 via a conventional connector 208. Voltage transients from or caused by the battery 206 are thus coupled directly into the source 204 of the P-channel power MOSFET 202.

A vehicle battery 206, which is coupled to the source 204 of the MOSFET 202, is considered herein to be a battery that provides starting current to a starter motor for an internal combustion engine and which provides electrical energy to various vehicle accessories. The battery 206 is considered herein to be a "voltage source."

In an alternate embodiment wherein the circuit 200 is used with an all-electric vehicle, the vehicle battery 206 is an array of batteries that provide running current to an electric drive motor, not shown, as well as vehicle accessories. An array of batteries is also considered herein to be a voltage source.

In another embodiment, the battery 206 is any power supply device that has a high slew rate or a relatively fast rising edge and is also considered herein to be a "voltage source." A high slew rate or fast rising edge is considered to be a slew rate greater or equal to the time constant of a slew-rate controlling capacitor 214 and the value of a prior art, pull-up resistor that would have been coupled between the source and gate and necessary to turn off the MOSFET.

In the prior art, a semiconductor MOSFET used as a switch is usually provided with a resistor that is connected directly between the source 204 and gate 210. A slew-rate limiting capacitor is also usually connected between the drain 212 and the gate 210 in order to control the slew rate of the voltage output from the drain.

An unfortunate operating characteristic of a prior art circuit having a gate resistively coupled to the source and capacitively coupled to the drain, is that the gate-drain capacitance provides a pathway around the MOSFET switch for transient voltages. More importantly, when a MOSFET switch is supposed to be turned off, the slew-rate controlling capacitor coupled to the gate, can cause a voltage spike to the source to cause the voltage on the gate to momentarily drop below the voltage on the source due to the capacitor's charge time. When the voltage on the gate of a P-channel MOSFET drops below the voltage on the source a P-channel MOSFET will be turned "on" propagating a spike through the power MOSFET from its source to its drain.

In order to prevent or reduce the propagation of a transient through the power MOSFET 202, it is important to prevent the voltage on the gate terminal 210 from dropping below the voltage on the source 204. Stated another way, the propagation of transients through the MOSFET 202 can be reduced or eliminated by holding the voltage on the gate 210 above or at least substantially equal to the source voltage.

In FIG. 2, a slew-controlling turn on circuit 213 commonly found on slew-rate controlled semiconductor switches comprises a capacitor 214 coupled between the drain 212 of the MOSFET 202 and its gate 210. The turn on circuit also typically comprises an N-channel MOSFET 216, which is coupled to the gate 210 through a current-limiting resistor 218.

Those of ordinary skill in the art will recognize that when the N-channel MOSFET 216 turns on and off, as will happen when the voltage on its gate 222 changes relative to the voltage on its grounded source 224, the voltage on the gate 210 of the P-channel power MOSFET 202 will change accordingly due to the fact that the gate 210 of the power MOSFET 202 is coupled to its drain 210 and indirectly coupled to voltage on its source 204 through a P-channel MOSFET 242 connected across the source 204 and gate 210 of the power MOSFET 202.

In the preferred embodiment, transient voltage propagation through the P-channel power MOSFET 202 is eliminated or at least reduced by "holding" the voltage on the gate 210 of the power MOSFET 202 above or at least substantially equal to the voltage on the source 204 of the power MOSFET 202. Such a result is realized by a turn off circuit 240 comprising a P-channel MOSFET 242 connected across the source 204 and gate 210 of the P-channel power MOSFET 202.

In the circuit of FIG. 2, the second P-channel MOSFET 242 is turned on, providing a near-zero impedance across the source 204 and drain 210 whenever the MOSFET 202 is supposed to be turned off. Keeping the source and gate voltages substantially equal to each other prevents or at least reduces the propagation of a voltage spike at the source 204 of the MOSFET 202 to its drain 212 and to a load device connected to the drain 212.

Providing a low-impedance across the source 204 and gate 210 of the power MOSFET 202 enables voltage and voltage transients input to the source 204 to also be applied to the gate 210 at the same time. When the second P-channel MOSFET 242 is turned on, it thus enables transient voltages on the source 204 to also be applied to the gate 210. The gate-source voltage of the P-channel power MOSFET 202 will therefore be either positive or zero but not negative. Holding the gate and source voltages "together" through the second P-channel MOSFET 242 keeps the first P-channel MOSFET 202 turned off, preventing the transmission or propagation of the transient from the source 204 to the drain 212.

The state of the second P-channel MOSFET 242 is controlled by voltage applied to its gate 244 from the collector 248 of a conventional PNP bipolar junction transistor (BJT) 246, the emitter 247 of which is electrically connected to the source 204 and battery 206 from which transient voltages are generated. The PNP BJT 246 is turned on and off by controlling the voltage applied to its base 249 using a second, N-channel MOSFET 260, the source 261 of which is coupled to the base 249 through a current limiting resistor. The gate 262 of the second N-channel MOSFET 260 is connected to and thus controlled by voltage on an on/off control input terminal 264 for the circuit 200. The drain 266 of the second, N-channel MOSFET 260 is connected to ground or other reference potential 268. Bleeder resistor 270 prevents the on/off terminal 264 from "floating" to an indeterminate voltage.

Those of ordinary skill in the art will recognize that a "high" voltage provided to the on/off control input 264 will cause the formation of a conductive channel in both of the N-channel MOSFETs 216, 260. The N-channel MOSFETs 216, 260 are thus turned "on" by a "high" voltage provided to the on/off control input 264.

When the N-channel MOSFETs 216, 260 are "on," current is able to readily flow through the MOSFETs 216, 260 due to the fact that the impedance or resistance of the respective channels is relatively low and preferably close to or substantially equal to zero ohms. As a result, when the N-channel MOSFETs 216, 260 are on, voltage on the gate 210 of the power MOSFET 202 is effectively bled to ground or other reference potential 268 through a current limiting resistor 218 and the first N-channel MOSFET 216, the source 224 of which is connected to ground 268.

Current also flows through the second N-channel MOSFET 260 to ground 268, which causes the voltage on the base 249 of the PNP BJT 246 to go "low" causing that transistor to turn "on." When the BJT 246 turns on, it drives current from the battery 206 into the gate 244 of the second P-channel MOSFET 242 causing the gate 244 voltage to go "high." When the voltage on the gate 244 of the second P-channel MOSFET 242 is high or substantially the same as the voltage on the source 245, which is connected to the source 204 of the power MOSFET 202, the second P-channel MOSFET 242 is turned "off." Stated another way, the resistance or impedance between the source 245 and drain 270 of the second P-channel MOSFET 242 is high, effectively disconnecting them from each other and thereby separating the source 204 and gate 210 of the power MOSFET 202 from each other as well, allowing the gate 210 to be pulled "low" by the first N-channel MOSFET 216.

When the voltage to on/off input terminal 264 is zero volts or "low," both N-channel transistors will turn "off." When the first N-channel MOSFET 216 is off, voltage on the drain 212 of the P-channel power MOSFET 202 is capacitively coupled to its base 210, causing the MOSFET 202 to turn off. When the second N-channel MOSFET 260 is off, the voltage on the base 249 of the PNP BJT 246 goes high, causing the BJT to turn off. A bleeder resistor 270 to ground allows the voltage on the gate of the second P-channel MOSFET 242 to go low, which enables that MOSFET 242 to turn on, thereby providing a zero or near-zero impedance across the source 204 and gate 210 of the P-channel power MOSFET 202, effectively holding the MOSFET 202 in an "off" state. The power MOSFET 202 remains shut off, even when a voltage transient appears at the source 204.

Figure 3:
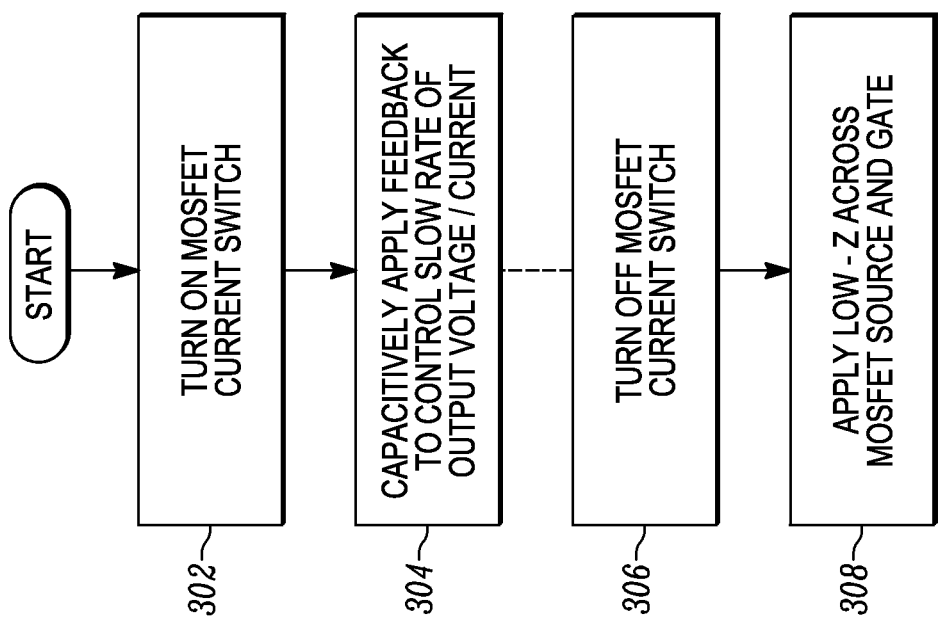
FIG. 3 is a flowchart depicting steps of a method for suppressing transient voltage propagation through a 3-terminal semiconductor switch such as a MOSFET.

Referring now to FIG. 3, a method of suppressing transient voltage propagation through a 3-terminal semiconductor switch, embodied as a P-channel MOSFET, comprises steps that include applying a low-impedance across the source and gate of the transistor when the transistor is to be in an off or high impedance state. Providing such impedance enables voltage spikes to the source to also be connected to the gate of the same device. The gate-source voltage is kept substantially equal to zero which will keep the transistor turned off. Conversely when the semiconductor is to be turned on, the method of controlling transient voltage propagation applies a high impedance across the source and gate allowing voltages input to the source to be conducted through the transistor to an output load.

At step 302, a P-channel power MOSFET is turned on by providing a low or negative gate-source voltage to the device. Simultaneously or shortly thereafter, at step 304 voltage from the drain is fed back to the gate, limiting the rate at which the voltage at the drain increase.

At step 306, which takes place some amount of time 305 after the power MOSFET has been on, the power MOSFET is shut off. At step 208, which takes place at the same time or shortly after the power MOSFET is shut off, a low or near-zero impedance is applied across the source and gate of the power MOSFET. Applying such an impedance across the source and gate essentially stops the MOSFET from conducting, which eliminates or at least reduces the propagation of a voltage on the source of the power MOSFET to the drain. Providing a second, P-channel MOSFET across the source and drain of a first P-channel power MOSFET and controlling the operation of the second MOSFET thus enables the first MOSFET to be kept in a high-impedance "off" state, stopping or at least reducing the propagation of transients through the first MOSFET.

The circuitry described above is effective for preventing the propagation of a transient along a supply line that normally carries a positive voltage. Those of ordinary skill in the art might recognize that if the P-channel and N-channel MOSFETs are replaced by their respective complements, the same circuit topology could be used on a power supply return line. As a practical matter, however, preventing the further propagation of a transient to a reference potential that has already passed through sensitive electronic devices might not prevent such devices from being damaged.

The foregoing description is for purposes of illustration only. The true scope of the invention is set forth in the following claims.

The invention claimed is:

1. A switching circuit, configured to prevent or at least reduce transient voltage propagation through a semiconductor switch, the output voltage slew rate of which is controlled using capacitive feedback, the switching circuit comprising:
   a three-terminal semiconductor switch having a first input terminal, which is configured to be coupled to a voltage source, a first output terminal configured to be coupled to a load, and a first control terminal;
a turn off circuit having a second input terminal coupled to the first input terminal, a second output terminal coupled to the first control terminal, and a second control terminal coupled to an on/off terminal for the switching circuit; and
a slew rate controlled turn on circuit having a third input terminal coupled to the first output terminal, a third output terminal coupled to the first control terminal, and a third control input terminal coupled to the on/off terminal.

2. The switching circuit of claim 1, wherein the semiconductor switch, the turn off circuit, and the turn on circuit are configured such that:
a first, high voltage provided to the on/off terminal configures the turn off circuit to have a high impedance and configures the slew-controlled turn on circuit to couple the first control terminal to a reference potential; and
a second, low voltage provided to the on/off terminal configures the turn off circuit to have a low impedance and configures the slew-rate controlled turn on circuit to de-couple the first control terminal from said reference potential.

3. The switching circuit of claim 1, wherein the three-terminal semiconductor switch comprises a P-channel metal oxide semiconductor field effect transistor (MOSFET) having a first source, first drain and first gate, the first source being the first input terminal, the first drain being the first output terminal, and wherein the turn off circuit comprises a P-channel MOSFET having a second source, second drain, and second gate, the second source being coupled to the first source, the second drain being coupled to the first gate, the second gate being coupled to the on/off terminal, and wherein the slew-controlled turn on circuit comprises a capacitor connected to the first drain and first gate.

4. The switching circuit of claim 1, wherein the slew-controlled turn on circuit further comprises:
an N-channel MOSFET having a drain coupled to the first control terminal, a source coupled to a reference potential, and a gate coupled to the on/off terminal;
wherein a positive gate-source voltage on the N-channel MOSFET causes the N-channel MOSFET and the three-terminal semiconductor switch to conduct current and, a zero or negative gate-source voltage causes the N-channel MOSFET and three-terminal semiconductor switch to turn off and additionally causes the turn-off circuit to suppress conduction of transient voltages through the three-terminal semiconductor switch.

5. The switching circuit of claim 1, wherein the semiconductor switch, the turn off circuit, and the turn on circuit are configured such that, a first signal provided to the on/off terminal disables the low-input impedance turn off circuit and turns on the slew-controlled turn on circuit, wherein a second and different signal from the on/off terminal causes the low-input impedance turn off circuit to provide a low impedance across the first input terminal and first control terminal.

6. The switching circuit of claim 1, wherein the three-terminal semiconductor switch comprises a P-channel metal oxide semiconductor field effect transistor (MOSFET) having a first source, first drain, and first gate, the first terminal being the first source, the first output being the first drain, wherein the low input impedance turn off circuit comprises a P-channel MOSFET having a second source, second drain, and second gate, the second source being coupled to the first source, the second drain being coupled to the first gate, the second gate being coupled to the on/off terminal, and wherein the slew-controlled turn on circuit comprises a capacitor connected to the first drain and first gate.

7. The switching circuit of claim 1, wherein the slew-controlled turn on circuit further comprises:
an N-channel MOSFET having a drain coupled to the first control terminal, a source coupled to a reference potential, and a gate coupled to the on/off terminal.

8. The switching circuit of claim 1, further comprising a vehicle battery coupled to the input terminal.

9. The switching circuit of claim 1, further comprising a power supply coupled to the input terminal.

10. A method of suppressing transient voltage propagation through a first, three-terminal semiconductor switch having a first input coupled to a voltage source, a first output, and a first control, the first semiconductor switch being configured to control the flow of current by providing a low impedance between the first input and first output in an on state and a high impedance between the first input and first output in an off state, the semiconductor switch having an output slew rate controlled by a capacitor coupled between the first output and first control, the method comprising:
providing a low impedance across the first input and the first control, when the semiconductor switch is in an off state;
when the semiconductor switch is in an on state, providing a high impedance across the first input and the first control.

11. The method of claim 10, wherein the first semiconductor switch is provided with a second, three-terminal semiconductor switch having a second input coupled to a voltage source, a second output, and a second control, the second semiconductor switch being configured to control the flow of current by providing a low impedance between the second input and the second output in an on state and a high impedance between the second input and the second output in an off state, the second input being coupled to the first input, the second output being coupled to the first control, wherein the step of providing a low impedance comprises:
applying a voltage to the second control, which causes the second semiconductor switch to provide a substantially zero impedance across the first input and the first control and thereby apply a voltage from the voltage source to the first control.

12. The method of claim 10, wherein the first and second three-terminal semiconductor switches are first and second P-channel MOSFET transistors, respectively, and wherein the step of providing a low impedance across the first input and the first control comprises applying a zero or negative-valued gate-source voltage to the second P-channel MOSFET, the step of providing a high impedance across the first input and the first control comprises applying a positive-valued gate source voltage to the second P-channel MOSFET.

13. The method of claim 10, further comprising a transistor which is coupled to the second, three-terminal semiconductor switch, the transistor having a second input, a second output, and a second control, the second input being coupled to the first input, the second output being coupled to the first control, wherein the step of providing a high impedance comprises:
applying a voltage to the second control, which causes the second semiconductor switch to provide a high resistance across the first input and the first control and disconnect the voltage from the voltage source from the first control.

\* \* \* \* \*